United States Patent [19]

Baumgartner et al.

[11] Patent Number: 4,691,149
[45] Date of Patent: Sep. 1, 1987

[54] APPARATUS AND METHOD FOR PROTECTING A MOTOR CONTROL CIRCUIT

[75] Inventors: Kenneth A. Baumgartner, Peoria, Ill.; William Pickering, University Heights, Ohio

[73] Assignee: Caterpillar Industrial Inc., Mentor, Ohio

[21] Appl. No.: 786,580

[22] Filed: Oct. 11, 1985

[51] Int. Cl.$^4$ .......................... G05B 5/00; H02H 7/09
[52] U.S. Cl. .................................... 318/331; 318/333; 318/341; 361/92; 361/101; 361/33
[58] Field of Search .............. 318/331, 333, 563, 341; 361/88, 101, 90, 91, 92, 93, 1, 23, 63, 65, 18, 33; 307/240; 363/124

[56] References Cited

U.S. PATENT DOCUMENTS

| | | | |
|---|---|---|---|
| 3,408,552 | 10/1968 | Weber | 361/88 X |
| 3,927,357 | 12/1975 | Konrad | 318/139 |
| 4,047,233 | 9/1977 | Yorks | 361/88 |
| 4,151,519 | 4/1979 | Swygert | 318/563 X |
| 4,216,517 | 8/1980 | Takahashi | 361/92 X |
| 4,241,299 | 12/1980 | Bertone | 318/331 X |
| 4,270,164 | 5/1981 | Wyman | 318/635 X |
| 4,291,357 | 9/1981 | Hong | 361/92 X |
| 4,339,701 | 7/1982 | Pritchard | 318/432 X |
| 4,348,709 | 9/1982 | Mauk | 361/92 |
| 4,432,030 | 2/1984 | Bricetti | 361/92 |
| 4,447,841 | 5/1984 | Kent | 361/92 X |
| 4,472,163 | 9/1984 | Melocik | 318/139 X |
| 4,484,127 | 11/1984 | Salihi | 318/802 |
| 4,508,999 | 4/1985 | Melocik et al. | 318/331 |

FOREIGN PATENT DOCUMENTS

| | | | |
|---|---|---|---|
| 2441316 | 8/1974 | Fed. Rep. of Germany. | |
| 0001918 | 1/1985 | Japan | 361/92 |

OTHER PUBLICATIONS

Patents Abstracts of Japan, vol. 4, No. 145 (E-29) (627) 10/14/80 & JP, A, 5596728 (Tokyo Shibaure Denki K.K.) 7/23/80.
Patents Abstracts of Japan, vol. 7, No. 45 (E-160) (1190) 2/23/83 & JP, A, 57194627 (Matsushita Denki Sangyo K.K.) 11/30/82.

Primary Examiner—William M. Shoop, Jr.
Assistant Examiner—Patrick C. Keane
Attorney, Agent, or Firm—Stephen L. Noe

[57] ABSTRACT

Motor control circuits having solid-state switching elements are commonly used on industrial vehicles such as lift trucks. A short circuit condition in the motor circuit can cause catastrophic failure of the semiconductor switching element. The instant invention detects such a short circuit condition and modifies the motor control signals supplied by a chopper circuit to a switching element. The apparatus includes a trigger circuit for receiving the motor control signals and sensing a voltage across the motor produced in response to electrical power delivered from a power supply.

3 Claims, 3 Drawing Figures

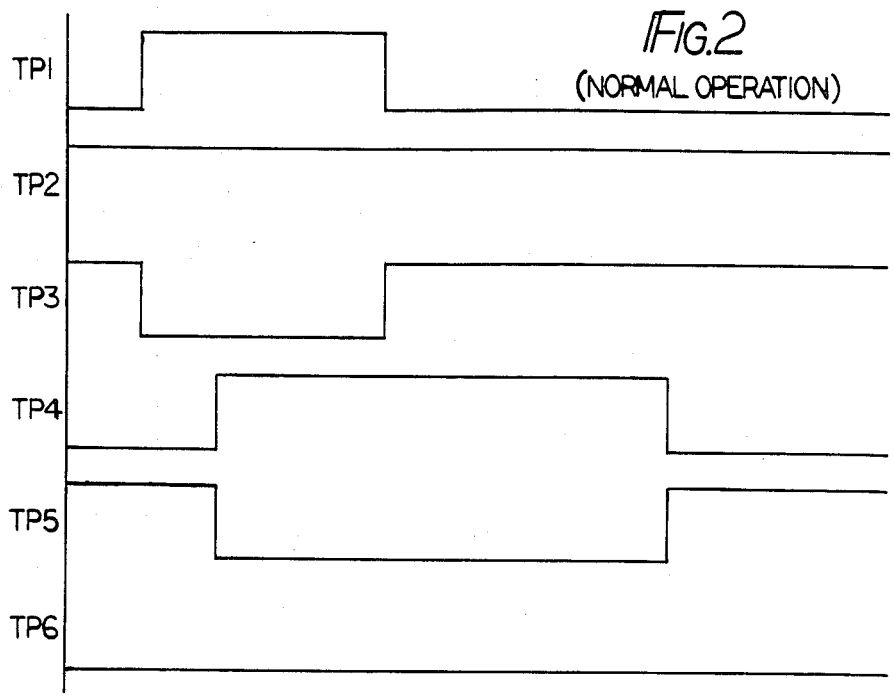
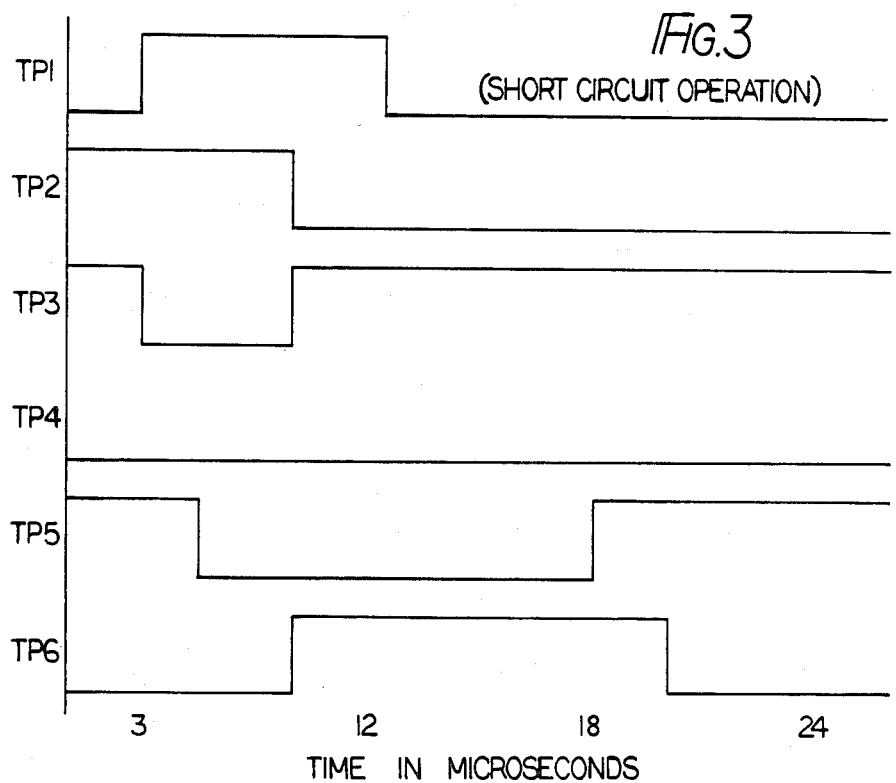

APPARATUS AND METHOD FOR PROTECTING A MOTOR CONTROL CIRCUIT

TECHNICAL FIELD

This invention relates generally to an apparatus and method for detecting a shorted condition of an electrical circuit, and, more particularly, to an apparatus and method for protecting an electrical motor control circuit from damage caused by a shorted circuit component.

BACKGROUND ART

Various motorized systems in use today include an electric motor powered by a battery or other source of electrical energy. The speed of the electric motor is commonly controlled by supplying power from the power source to the motor through a serially connected solid-state switching element. The switching element can be, for example, a transistor or silicon controlled rectifier. The switching element is typically pulse controlled by a signal chopper of conventional design.

In such systems, various circuit elements are commonly connected in parallel with the motor. A short circuit condition in one of these circuit elements can lead to excessive current flow through the switching element. Owing to the fact that such switching elements are designed for specific maximum current flows, the excessive current flow caused by a short circuit condition is likely to damage the switching element.

In a typical motor control circuit, the power source is connected through a transistor switching element to one side of the motor, with the other side of the motor being connected to the opposite pole of the power source. A flyback diode is typically connected across the combined field and armature of the motor to form a circulating current path for motor current during the period of time that the switching element is turned "off". The flyback diode is subjected to particularly difficult operating conditions, and occasionally fails as a result of being overstressed during operation. A shorted flyback diode causes excessive current to flow from the power source, through the switching element and the shorted diode, back to the opposite pole of the power source. Such extreme magnitudes of current flow are known to quickly destroy the solid-state switching element.

It is desirable to sense the presence of such a short circuit condition and exercise appropriate control strategies in the event such a short circuit condition is detected. It is known, for example, to sense a short circuit condition by monitoring the magnitude of current flowing through a shunt in series with the motor in a meter control circuit, and to interrupt the flow of current in the event it becomes excessive. However, in some situations it is not desirable to interpose a current shunt in the motor control circuit, and in any event, a shunt in series with the motor cannot detect a shorted flyback diode. Likewise, it may be undesirable to shut down the motor control circuit permanently as it is possible that the short circuit condition is only temporary and that the motor control circuit can resume proper operation after a temporary interruption.

The present invention is directed to overcoming one or more of the problems as set forth above.

DISCLOSURE OF THE INVENTION

In one aspect of the present invention, an apparatus for sensing a short circuit condition of a motor control circuit is provided. The apparatus includes a power supply for providing a source of electrical power, and a motor connected across the power source. A chopper controllably produces motor control signals. A switching element receives the motor control signals and responsively delivers electrical power from the power source to the motor. The switching element is serially connected between the motor and the power source. A trigger circuit also receives the motor control signals, senses a voltage across the motor produced in response to the delivered electrical power, and controllably produces a trigger signal in response to receiving the motor control signals and failing to sense the produced motor voltage. An inhibit circuit controllably modifies the motor control signals in response to receiving the produced trigger signal.

In a second aspect of the present invention, a method for sensing a short circuit condition of a motor control circuit is provided. The motor control circuit includes a source of electrical power, a motor connected across the power source, a chopper circuit for controllably producing motor control signals, and a switching element for receiving the motor control signals and responsively delivering electrical power from the power source to the motor. The switching element is serially connected between the motor and the power source. The method comprises the steps of receiving the motor control signals and sensing the voltage across the motor produced in response to the delivered electrical power. In response to receiving the motor control signals and failing to sense the produced motor voltage, a trigger signal is produced, and the motor control signals are controllably modified in response to the trigger signal.

The present invention provides a fast reacting circuit for protecting a motor control. The circuit advantageously requires no serial current measuring device in the motor circuit, and is capable of discriminating between a continuous short circuit condition and a temporary short circuit condition.

BRIEF DESCRIPTION OF THE DRAWINGS

For a better understanding of the present invention, reference may be made to the accompanying drawings, in which:

FIGS. 2 and 3 are illustrative waveforms used to explain the operation of the circuit shown in FIG. 1.

BEST MODE FOR CARRYING OUT THE INVENTION

Figure 1:
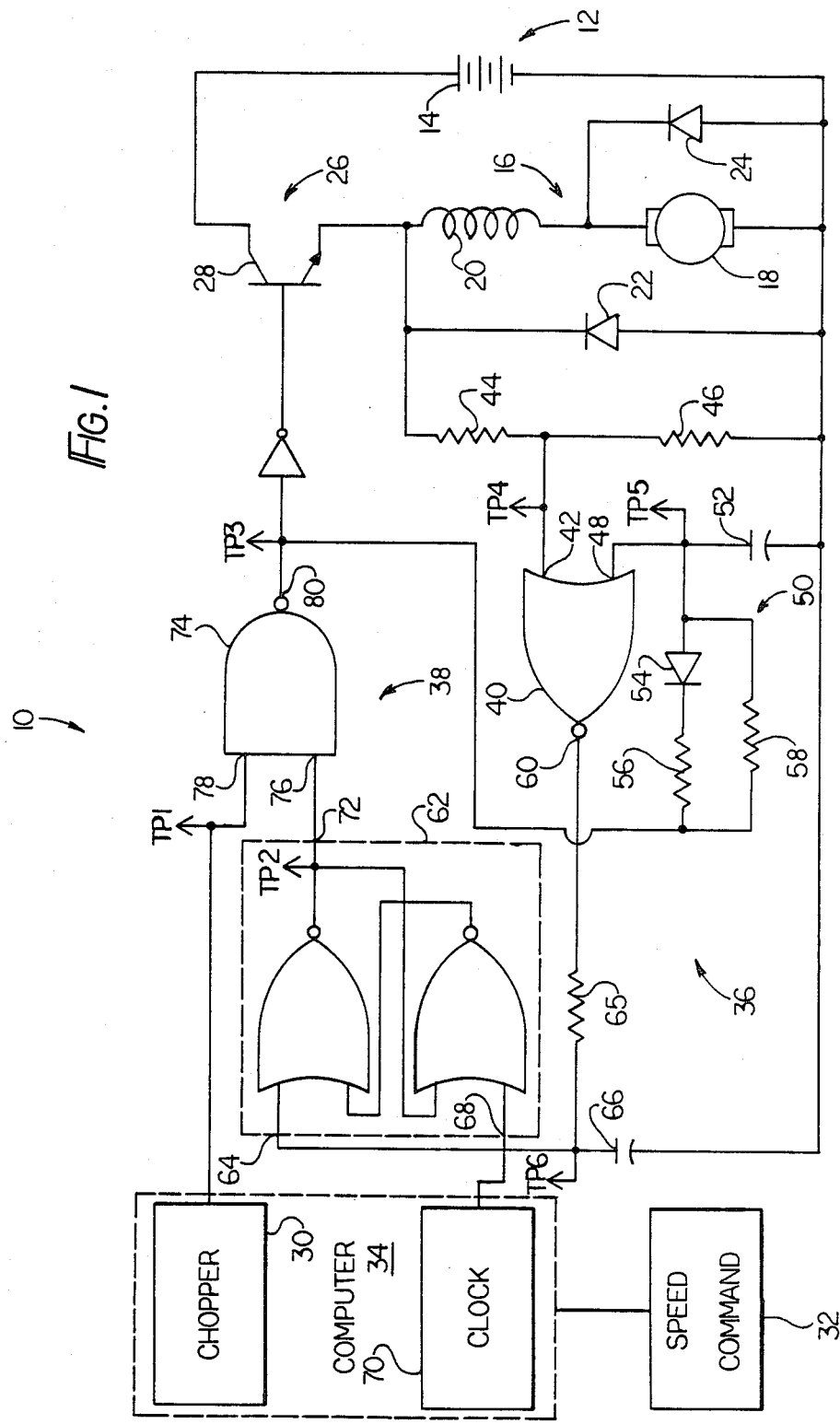
FIG. 1 is a schematic diagram of a motor control system incorporating an embodiment of the present invention.

Referring first to FIG. 1, an apparatus embodying certain of the principles of the present invention is generally indicated by the reference numeral 10. It should be understood that the following detailed description relates to the best presently known embodiment of the apparatus 10. However, the apparatus 10 can assume numerous other embodiments, as will become apparent to those skilled in the art, without departing from the appended claims.

The apparatus 10 includes a power supply means 12, for example, a battery 14, for providing a source of electrical power. A motor 16 having an armature 18 and a field 20 is connected across the power supply means 12. The motor 16 is, for example, a pump motor used to operate an hydraulic pump in an industrial vehicle such as a lift truck. A flyback diode 22 is connected across the series combination of armature 18 and field 20. Some motor circuits also include a plugging diode 24 connected across the motor armature 18.

A switch means 26 is serially connected between the power supply means 12 and the motor 16. The switch means 26 is preferably a solid-state switch, for example, a high power transistor 28, having a collector connected to one terminal of the power supply means 12 and an emitter connected to the motor 16. A chopper means 30 controllably produces motor control signals, for example, a time modulated pulse train signal. The pulse modulated motor control signals are ultimately delivered from the chopper means 30 to a base terminal of the transistor 28.

In a typical embodiment, a speed command is supplied to the chopper means 30 from a speed command means 32. The time modulated motor control signals are produced responsive to the speed command signal, and the switch means 26 is responsively turned on and off to vary the speed of the motor 16. In the preferred embodiment, the chopper means 30 is an integral part of a computer 34. It is known in the art to produce time modulated signals utilizing a microprocessor or other form of computer in this manner. It is also known to provide equivalent chopper means via conventional hard wired circuitry.

A trigger means 36 receives the motor control signals, senses a voltage across the motor 16 produced in response to the delivered electrical power, and controllably produces a trigger signal in response to receiving the motor control signals and to failing to sense the produced motor voltage. An inhibit means 38 then controllably modifies the motor control signals in response to receiving the trigger signal. The trigger means 36 includes a first logic gate 40. The logic gate 40 has a first input terminal 42 connected through a resistor 44 to the junction of the switch means 26 and the motor 16. A second resistor 46 is connected from the first input terminal 42 of the first logic gate 40 to circuit ground.

The first logic gate 40 also has a second input terminal 48 connected through a time delay circuit 50 to the inhibit means 38. The time delay circuit 50 includes a capacitor 52 connected from the second input terminal 48 to circuit ground. A diode 54 is also connected to the second input terminal 48 and is connected in series with a resistor 56. The combination of the diode 54 and resistor 56 are connected in parallel with a resistor 58. Finally, the first logic gate 40 has an output terminal 60. The first logic gate 40 is, for example, a two input NOR gate of conventional design.

The inhibit means 38 includes a latch 62. In the preferred embodiment, the latch 62 is an R/S flip-flop composed of dual cross-coupled NOR gates. A first input terminal 64 of the latch 62 is connected to the output terminal 60 of the first logic gate 40 through a resistor 65, and is also connected through a capacitor 66 to circuit ground. A second input terminal 68 is connected to a clock means 70. The clock means 70 periodically produces a reset signal, and the inhibit means 38 ceases to modify the mode of control signals in response to receiving the clock signal in the absence of the trigger signal. The clock means 70 is, for example, a portion of the microprocessor 34. The clock means 70 can also be implemented as an individual hard wired circuit. The latch 62 also includes an output terminal 72.

The inhibit means 38 also includes a second logic gate 74 having a first input terminal 76 connected to the latch output terminal 72. A second input terminal 78 is connected to the chopper means 30, and an output terminal 80 is connected to the base of the switch means 26 and to the second input terminal 48 of the first logic gate 40 through the time delay circuit 50. The second logic gate 74 is, in the preferred embodiment, a two input NAND gate of conventional design.

The ratings and values discussed above with respect to the various electrical elements are for exemplary purposes only. Alterations of the circuit and the use of electrical elements of different constructions or ratings will be readily apparent to those skilled in the art. Such alterations or substitutions can be implemented without departing from the appended claims.

INDUSTRIAL APPLICABILITY

Operation of the instant invention is best described in conjunction with its use in a typical industrial application, for example, in association with an hydraulic pump motor of an industrial lift truck. The speed requirements of such a pump motor typically vary according to the functions being performed at any point in time by the hydraulic circuitry. For example, power steering requires a relatively low pump motor speed as opposed to elevation of the mast which can require a relatively fast motor speed. The variety of different motor needs is typically controlled by a chopper control circuit, for example, the chopper means 30, which produces a time duration modulated pulse control signal in a conventional manner. This pulse control signal is utilized to rapidly switch "on" and "off" a switching element, for example, the switch means 26. Responsively, power is delivered from a power supply to the motor in a series of current pulses, with the mean power delivered over a period of time determining the speed at which the motor operates.

A plurality of test points, labeled TP1–TP6, are indicated on the schematic diagram of FIG. 1. Representative waveforms found at each of these test points under various operating conditions are set forth in FIGS. 2 and 3. In the case of waveforms representing signals at points in the circuit having significant reactance, for example TP4–TP6, the actual DC waveforms are omitted and only the logic switching waveforms are shown for clarity and ease of understanding. The exact switching voltage of the various logic components varies with the components selected, and for this discussion is assumed to be approximately 50% of the supply voltage. Reference to the waveforms and to FIG. 1 throughout the following discussion will be of value.

The waveforms of FIG. 2 are representative of a normal operating condition of the chopper and motor circuit. Motor control signals produced by the chopper means 30 are delivered to the second logic gate 74 at the second input terminal 78. This is depicted at TP1 in FIG. 2. These motor control signals are normally delivered to the switch means 26, as seen at TP3. The motor control signals are readily transrerred through the second logic gate 74 so long as the signal at TP2 is "high" throughout the period that the motor control signal at TP1 is "high".

The signal at TP3 is also delivered through the time delay means 50 to the second input terminal 48 of the first logic gate 40, as shown at TP5. The signal at the first input terminal 42 of the first logic gate 40, as shown at TP4, is responsive to the voltage developed across the motor 16 and its parallel connected circuit components, for example, the flyback diode 22. The voltage magnitude of the signal at TP4 is reduced by the voltage divider comprised of a pair of resistors 44,46. This voltage divider is a level shifting device for producing a suitable logic level signal from the voltage present across the motor 16. The value of the resistors 44,46 is selected to deliver a logic "high" signal at TP4 in response to substantially full battery voltage across the motor 16, and a logic "low" signal in response to less than substantially full battery voltage across the motor 16. So long as both input terminals 42,48 of the first logic gate 40 are not simultaneously "low", the output terminal 60 remains "low" at TP6, and the latch 62 is not set. Owing to the reset signal being produced by the clock means 70 and periodically delivered to the reset terminal 68 of the latch 62, the latch 62 is maintained in the reset condition, and the output signal delivered to the second logic gate 74 remains "high".

The reset signal is delivered from the clock means 70 at periodic intervals of, for example, 10 milliseconds. In the preferred embodiment, the motor 16 is pulsed at a maximum rate of 7800 hertz. Assuming a minimum pulse duty factor of 8 microseconds, the 10 millisecond reset pulse insures that a short circuit condition is adequately protected against, while providing a reasonably short reset time interval.

Referring now to the waveforms shown in FIG. 3, a short circuit condition is described. In response, for example, to a shorted flyback diode 22, the resistance between the switching element 26 and circuit ground is considerably reduced from normal operating conditions. Consequently, the voltage across the pair of voltage divider resistors 44,46 is reduced sufficiently to produce a logic "low" signal at the input terminal 42 of the first logic gate 40, shown at TP4. Responsively, the first logic gate 40 delivers a logic "high" signal to the first input terminal 64 of the latch 62. In turn, the latch 62 delivers a logic "high" signal to the first input terminal 76 of the second logic gate 74. This logic "high" signal interrupts or blocks the motor control signal from the chopper means 30 and prevents it from continuing to be delivered, at TP3, to the switch means 26. Therefore, the switch means 26 is turned "off" before the excessive current flowing through the shorted flyback diode 22 can damage the transistor 28 and associated components.

Periodically, for example, approximately every 10 milliseconds, a reset signal is delivered by the clock means 70 to the second input terminal 68 of the latch 62, and the motor control signal from the chopper means 30 is again delivered to the switch means 26. If the short circuit condition was temporary and no longer exists, circuit operation returns to normal and the waveforms shown in FIG. 2 again apply. However, assuming that the short circuit condition continues to exist, only a brief current pulse is supplied by the switch means 26 before the motor control signals are again inhibited by the second logic gate 74. Therefore, the apparatus 10 quickly detects a short circuit condition in the motor circuit and prevents damage to the switch means 26 and associated circuitry.

Other aspects, objects, advantages, and uses of this invention can be obtained from a study of the drawings, the disclosure, and the appended claims.

We claim:

1. Apparatus for sensing a short circuit condition of a motor control circuit, comprising:

a battery having first and second battery poles;

a transistor having an emitter terminal, a base terminal, and a collector terminal connected to one of said battery first and second poles;

a motor having a first motor terminal connected to the other of said battery first and second poles, and a second motor terminal connected to said transistor emitter terminal;

chopper means for controllably producing motor control signals;

clock means for periodically producing a reset signal;

a first logic gate having a second input terminal, an output terminal, and a first input terminal connected to said transistor emitter terminal;

a latch having an output terminal, a first input terminal connected to said first logic gate output terminal, and a second input terminal connected to said clock means; and a second logic gate having a first input terminal connected to said latch output terminal, a second input terminal connected to said chopper means, and an output terminal connected to said transistor base terminal and said first logic gate second input terminal.

2. Apparatus for sensing a short circuit condition of a motor control circuit, comprising power supply means for providing a source of electrical power;

a motor connected across said power supply means;

chopper means for controllably producing motor control signals;

switch means for receiving said motor control signals and delivering electrical power from said power supply means to said motor in response to said received motor control signals, said switch means being serially connected between said motor and said power supply means;

means for sensing voltages across said motor produced in response to said delivered electrical power and producing voltage level signals in response to said sensed voltages;

trigger means for receiving each of said motor control signals and said voltage level signals, and controllably producing a trigger signal in response to receiving said motor control signals and failing to receive said voltage level signals;

clock means for periodically producing a reset signal; and inhibit means for controllably modifying said motor control signals in response to receiving said trigger signal; and wherein said trigger means includes a first logic gate having a first input terminal connected to the junction of said switch means and said motor, a second input terminal connected to said inhibit means, and an output terminal, and said inhibit means includes a latch having a first input terminal connected to said first logic gate output terminal, a second input terminal connected to said clock means, and an output terminal, and a second logic gate, having a first input terminal, connected to said latch output terminal, a second input terminal connected to said chopper means, and an output terminal connected to said switch means and said first logic gate second input terminal.

3. Apparatus for sensing a short circuit condition of a motor control circuit, comprising:

power supply means for providing a source of electrical power;

a motor connected across said power supply means;

chopper means for controllably producing motor control signals;

switch means for receiving said motor control signals and delivering electrical power from said power supply means to said motor in response to said received motor control signals, said switch means being serially connected between said motor and said power supply means;

means for sensing voltages across said motor produced in response to said delivered electrical power and producing voltage level signals in response to said sensed voltages;

trigger means for receiving each of said motor control signals and said voltage level signals and controllably producing a trigger signal in response to receiving said motor control signals and failing to receive said voltage level signals;

clock means for periodically producing a reset signal; and inhibit means for controllably modifying said motor control signals in response to receiving said trigger signal; and wherein said trigger means includes a first logic gate having a first input terminal connected to the junction of said switch means and said motor, a second input terminal connected to said inhibit means, and an output terminal, and said inhibit means includes a latch having a first input terminal connected to said first logic gate output terminal, a second input terminal connected to said clock means, and an output terminal, and a second logic gate, having a first input terminal, connected to said latch output terminal, a second input terminal connected to said chopper means, and an output terminal connected to said switch means and said first logic gate second input terminal, and wherein said inhibit means ceases to modify said motor control signals in response to receiving said clock signal in the absence of said trigger signal.

* * * * *